United States Patent [19]
Matsuda et al.

[11] Patent Number: 5,870,000
[45] Date of Patent: Feb. 9, 1999

[54] OSCILLATION CIRCUIT AND PLL CIRCUIT USING SAME

[75] Inventors: Atsushi Matsuda; Yuji Segawa, both of Kawasaki, Japan

[73] Assignee: Fujitsu Limited, Kawasaki, Japan

[21] Appl. No.: 805,365

[22] Filed: Feb. 24, 1997

[30] Foreign Application Priority Data

May 21, 1996 [JP] Japan .................................... 8-125528

[51] Int. Cl.$^6$ ........................................................ H03L 7/00
[52] U.S. Cl. ............................. 331/34; 331/111; 331/143
[58] Field of Search ............................... 331/34, 14, 111, 331/143; 327/147, 156, 157

[56] References Cited

U.S. PATENT DOCUMENTS

| | | | |
|---|---|---|---|
| 4,742,315 | 5/1988 | Schreilechner | 331/143 |
| 5,592,120 | 1/1997 | Palmer et al. | 327/157 |
| 5,668,508 | 9/1997 | Pulvirenti et al. | 331/111 |

FOREIGN PATENT DOCUMENTS

| | | |
|---|---|---|
| 59-117817 | 7/1984 | Japan . |
| 5-327428 | 12/1993 | Japan . |

*Primary Examiner*—Son T. Dinh
*Attorney, Agent, or Firm*—Nikaido, Marmelstein, Murray & Oram LLP

[57] ABSTRACT

An oscillation circuit for producing an output whose frequency accords with an input voltage value, comprises a first constant current source whose current has a value according to the input voltage value; a charge capacitor to be charged by the first constant current source; a comparator having one input terminal connected to a charge terminal of the charge capacitor to be charged and an other input terminal supplied with a first reference voltage, for comparing inputs to both input terminals with each other and outputting an output signal having a high level or a low level; and first switch means for pulling down a potential of the charge terminal of the charge capacitor to a second reference voltage lower than the first reference voltage under control by an output of the comparator.

11 Claims, 9 Drawing Sheets

OSCILLATION CIRCUIT AND PLL CIRCUIT USING SAME

BACKGROUND OF THE INVENTION

1. Field of the Invention

The present invention relates to a voltage-controlled oscillation circuit for producing an output having a frequency proportional to the value of the input voltage and a PLL (Phase Locked Loop) circuit using this oscillation circuit, and, more particularly, an improvement of an oscillation circuit capable of producing an output in a sufficient frequency range even on a low supply voltage.

2. Description of the Related Art

PLL circuits are widely used in, for example, digital display devices, radio devices and the like, as circuits to produce an output synchronous with a received signal. This PLL circuit generally has a voltage-controlled oscillation circuit, which compares the phase of an input signal with the phase of a comparison signal that is acquired by frequency-dividing an output signal by N, and produces a voltage proportional to a voltage value corresponding to the difference between those phases.

Figure 11:
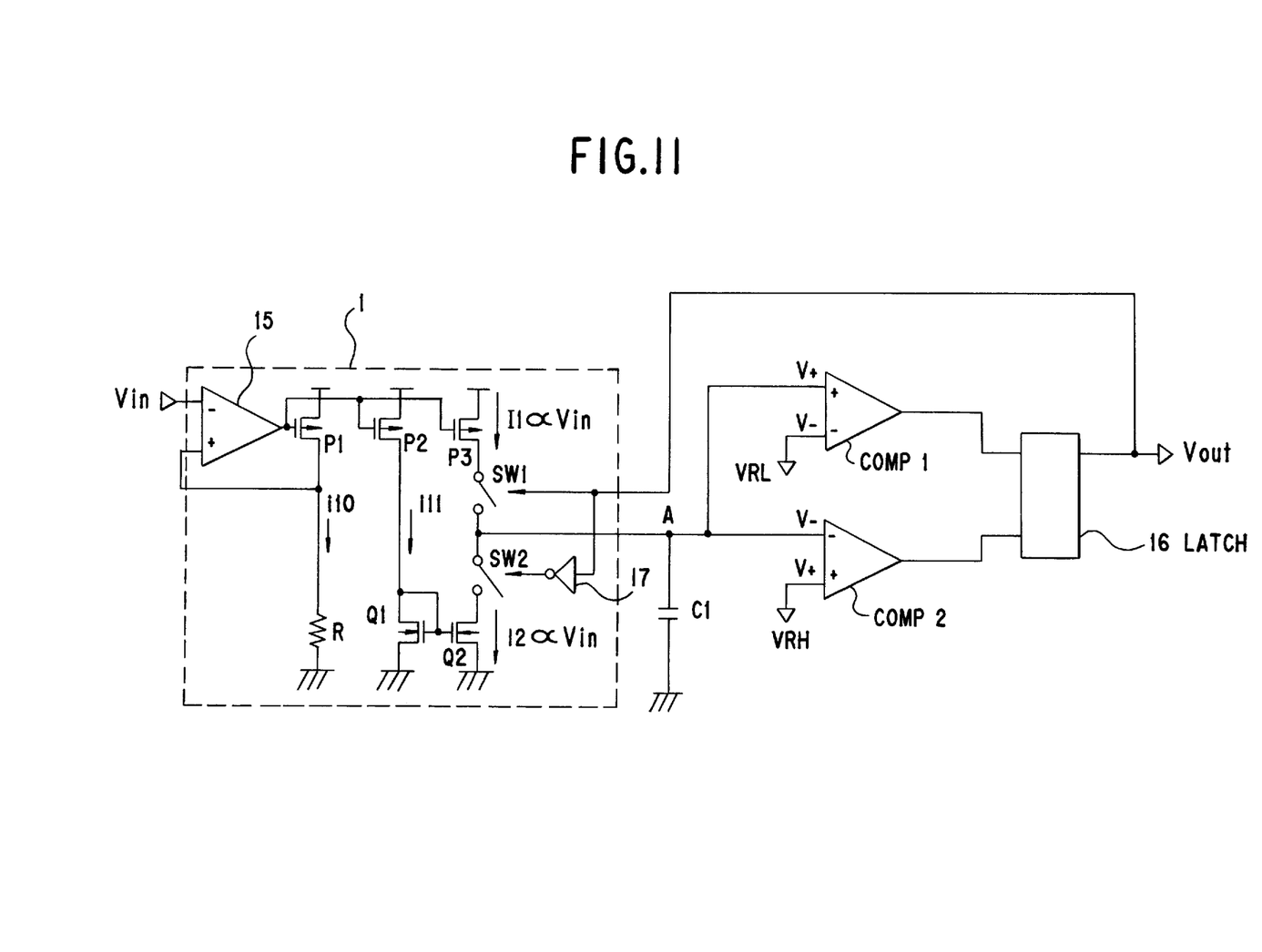
FIG. 11 is a circuit diagram exemplifying a conventional voltage-controlled oscillation circuit.

FIG. 11 is a circuit diagram exemplifying a conventional voltage-controlled oscillation circuit. This oscillation circuit comprises a voltage-current converter 1, a charge/discharge capacitor C1, comparators comp1 and comp2 and a latch circuit 16. The voltage-current converter 1 produces currents I1 and I2 proportional to the voltage value of an input voltage Vin and alters the direction of the current output according to the output of the latch circuit 16. The comparators comp1 and comp2 respectively use a lower reference voltage VRL and a higher reference voltage VRH for comparison. The voltage-current converter 1 includes a differential amplifier 15, current sources P1, P2 and P3, each comprised of a P channel transistor, which respectively produce currents i10, i11 and I1 proportional to the voltage value of the input Vin, N channel transistors Q1 and Q2, which constitute a current mirror circuit, and switches SW1 and SW2.

Figure 12:
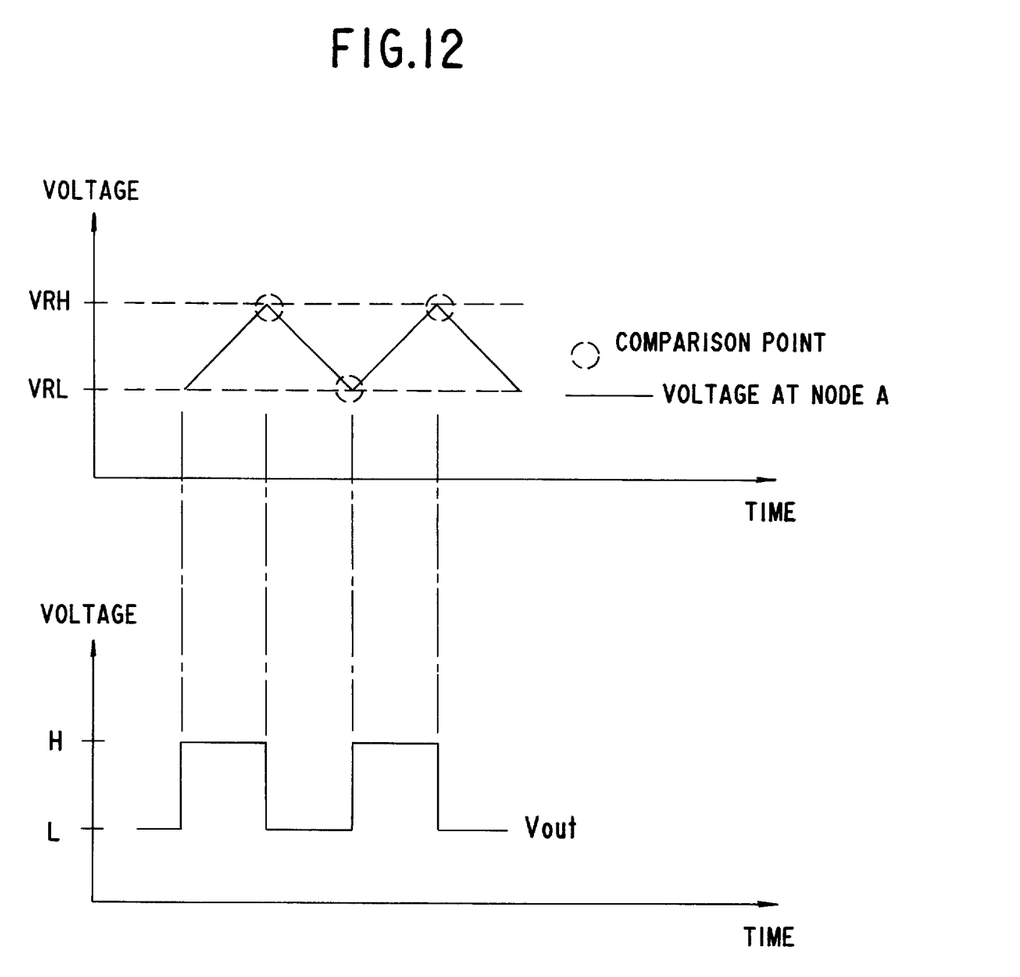
FIG. 12 is a waveform diagram for explaining the operation of the voltage-controlled oscillation circuit in FIG. 11.

FIG. 12 is a waveform diagram for explaining the operation of the voltage-controlled oscillation circuit. When an output Vout is at an H level, for example, the switch SW1 is closed and the switch SW2 is opened, causing the current I1 to flow toward the capacitor C1 from the current source P3. Consequently, the potential at a node A rises toward the reference voltage VRH. When the potential at the node A reaches the reference voltage VRH, the output of the comparator comp2 changes its level to an L level from an H level, causing the level of the output Vout to be changed to an L level from the H level via the latch circuit 16. As a result, the switch SW1 is open and the switch SW2 is closed, causing the current I2 to flow from the capacitor C1 to the current source I2. When the potential at node A reaches to the reference voltage VRL, the output of the comparator comp1 changes to an L level from an H level, causing the level of the output Vout to be changed to an L level from the H level via the latch circuit 16. As a result, the switch SW2 is opened and the switch SW1 is closed. The operation then returns to the initial operation.

As apparent from the above, the potential at the node A oscillates between the reference voltages VRH and VRL in accordance with the charging and discharging of the capacitor C1. This provides a clock pulse having H and L levels as the output Vout. The frequency of the output Vout then is determined by the charging and discharging speeds of the capacitor C1, which are proportional to the current values I1 and I2 proportional to the input voltage Vin. Thus, the output Vout has a frequency according to the value of the input voltage Vin.

Because of the recent tendency of the supply voltage becoming lower and lower, however, the voltage-controlled oscillation circuit shown in FIG. 11 suffers a narrower output frequency range. As the supply voltage becomes lower, particularly, the low frequency range tends to be lost.

The two comparators comp1 and comp2 receive the high reference voltage VRH and low reference voltage VRL respectively as their one input signals and receive the voltage at the node A as the other input signals. The comparator comp1 performs comparison on a voltage near the low reference voltage VRL, and the comparator comp2 performs comparison on a voltage near the high reference voltage VRH. From the viewpoint of the circuit characteristics of comparators, therefore, it is necessary to set the reference voltages VRH and VRL within the input range that guarantees the linear operation of comparators.

As the supply voltage decreases, the input range of comparators is inclined to become narrower. If the reference voltages VRH and VRL are designed to lie within that narrow input range, therefore, their voltage difference $\Delta V$ (=VRH−VRL) becomes smaller. This means that the pulse width of the output Vout shown in FIG. 12 is reduced, and the output frequency range shifts toward the higher level, thus losing the low frequency band.

If the reference voltages VRH and VRL are set to the upper and lower limits of the input range that can ensure the linear operation of comparators, the operation of comparators becomes slower. This slows the response speed of the voltage-controlled oscillation circuit, shifting the oscillation frequency.

This problem may be overcome by increasing the capacitance of the capacitor C1. This solution however increases the area of the capacitor formed in the integrated circuit, and thus stands in the way of improving the integration. Alternatively, the currents I1 and I2 may be designed to be smaller, which however is not so preferable because the current values that are proportional to the input voltage Vin should be set as large as possible in order to increase the operational range of the voltage-controlled oscillation circuit.

SUMMARY OF THE INVENTION

Accordingly, it is a primary objective of the present invention to provide an oscillation circuit which is free of the aforementioned conventional problems and has the output frequency range that does not depend on the supply voltage.

It is another objective of this invention to provide an oscillation circuit which can secure a sufficient output frequency range even when the supply voltage decreases.

It is a further objective of this invention to provide a PLL circuit which uses those oscillation circuits.

To achieve the first and second objects, according to the first aspect of this invention, an oscillation circuit for producing an output whose frequency accords with an input voltage value comprises a first constant current source whose current has a value according to the input voltage value; a charge capacitor to be charged by the first constant current source; a comparator having one input terminal connected to a charge terminal of the charge capacitor to be charged and an other input terminal supplied with a first reference voltage, for comparing inputs to both input terminals with each other and outputting an output signal having a high level or a low level; and first switch means for pulling down a potential of the charge terminal of the charge capacitor to a second reference voltage lower than the first reference voltage under control by an output of the comparator.

It is preferable that the first reference voltage should be set to a voltage value near a middle value in the input range which ensures the linear operation of the comparator.

To achieve the above objects, according to the second aspect of this invention, an oscillation circuit for producing an output whose frequency accords with an input voltage value, comprises a second constant current source whose current has a value according to the input voltage value; a discharge capacitor to be discharged by the second constant current source; a comparator having one input terminal operatively connected to a discharge terminal of the charge capacitor to be discharged and an other input terminal supplied with a first reference voltage, for comparing inputs to both input terminals with each other and outputting an output signal having a high level or a low level; and second switch means for pulling up a potential of the discharge terminal of the discharge capacitor to a third reference voltage higher than the first reference voltage under control by an output of the comparator.

In the second aspect, it is preferable that the first reference voltage should be set to a voltage value near a middle value in the input range which ensures the linear operation of the comparator.

To achieve the above objects, according to the third aspect of this invention, an oscillation circuit for producing an output whose frequency accords with an input voltage value, comprises a voltage-current converter having first and second constant current sources whose currents have values according to the input voltage value; a charge/discharge capacitor to be charged with the first constant current and discharged with the second constant current; a comparator having one input terminal operatively connected to a charge/discharge terminal of the charge/discharge capacitor to be charged and discharged and an other input terminal supplied with a first reference voltage, for comparing inputs to both input terminals with each other and outputting an output signal having a high level or a low level; and a high/low reference voltage generator for, under control by an output of the comparator, pulling up a potential of the charge/discharge terminal of the charge/discharge capacitor to a second reference voltage higher than the first reference voltage when potentials of both input terminals of the comparator match with each other during charging of the charge/discharge capacitor, and pulling down the potential of the charge/discharge terminal of the charge/discharge capacitor to a third reference voltage lower than the first reference voltage when the potentials of both input terminals of the comparator match with each other during discharging of the charge/discharge capacitor, whereby the voltage-current converter is controlled by the output of the comparator in such a manner as to connect the second constant current source to the charge/discharge capacitor after the potential of the charge/discharge terminal of the charge/discharge capacitor is pulled up to the second reference voltage and to connect the first constant current source to the charge/discharge capacitor after the potential of the charge/discharge terminal of the charge/discharge capacitor is pulled down to the third reference voltage.

In the third aspect, it is preferable that the first reference voltage should be set to a voltage value near a middle value in the input range which ensures the linear operation of the comparator.

According to this invention, one input terminal of the comparator is operatively connected with the terminal of the capacitor which is discharged so that its potential falls from the second reference voltage or which is charged so that its potential rises from the third reference voltage and the other input terminal of the comparator is supplied with the first reference voltage which lies between the second and third reference voltages. Therefore, the comparison of the comparator is always performed on a voltage near the first reference voltage. Even if the supply voltage drops, therefore, the linear operation of the comparator is not influenced and a sufficiently wide frequency band characteristic and a high response speed can be ensured. Since the linear characteristic of the comparator does not depend on the amplitude of the potential at one input terminal of the comparator and is guaranteed, the capacitance of the capacitor which is connected to that input terminal can be reduced.

To achieve the third object, according to the fourth aspect of this invention, a PLL circuit for generating an output signal of a frequency a predetermined number of times higher than that of an input signal and synchronous in phase with the input signal, comprises a phase comparator for detecting a phase difference between the input signal and a comparison signal acquired by frequency-dividing the output signal by a predetermined number, and outputting an output voltage according to the phase difference; an oscillation circuit according to any one of the first to third aspects, for receiving an output voltage of the phase comparator as an input voltage and producing the output signal as an output; and a frequency divider for frequency-dividing the output signal by the predetermined number.

DETAILED DESCRIPTION OF THE PREFERRED EMBODIMENT

A preferred embodiment of the present invention will now be described with reference to the accompanying drawings.

Figure 1:
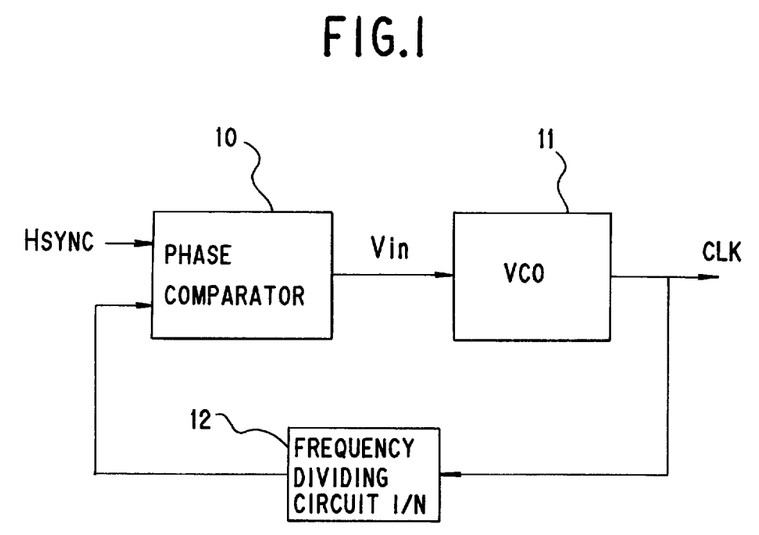
FIG. 1 is a block diagram showing the structure of a PLL circuit which uses a voltage-controlled oscillation circuit according to this invention.

FIG. 1 presents a block diagram showing the structure of a PLL circuit which uses a voltage-controlled oscillation circuit according to this invention. This PLL circuit includes a phase comparator 10, a voltage-controlled oscillation circuit 11 and a frequency divider 12. The phase comparator 10 compares a horizontal synchronous signal Hsync in a TV signal with the output of the frequency divider 12, for example, and the voltage-controlled oscillation circuit 11 produces an output CLK whose frequency is proportional to the output voltage Vin according to the phase difference. For instance, the output voltage Vin is so set as to increase or decrease around the output voltage Vin at the time of the zero phase difference between the two inputs of the phase comparator 10, in accordance with whether that phase difference is positive or negative. Accordingly, the frequency of the output CLK has a frequency band around the locked-in frequency which is N times the frequency of the horizontal synchronous signal Hsync.

Figure 2:
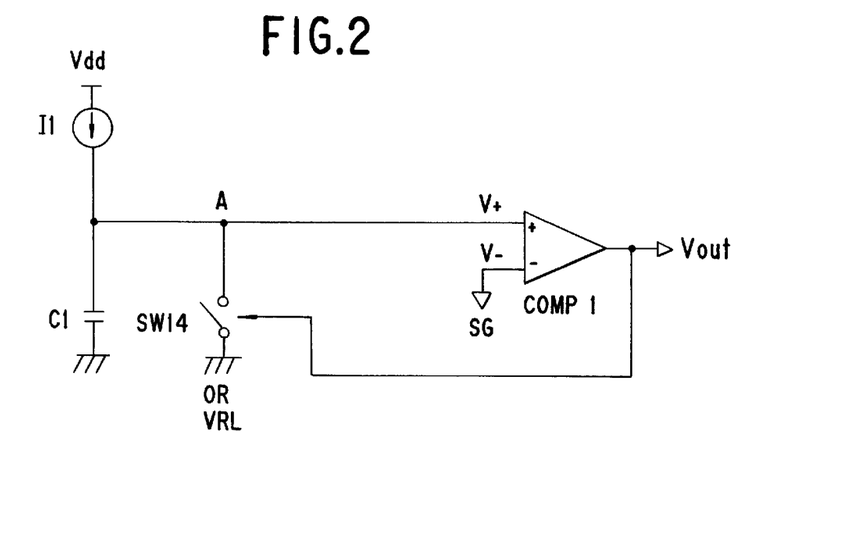
FIG. 2 is a circuit diagram showing the principle structure of the voltage-controlled oscillation circuit embodying this invention.
Figure 3:
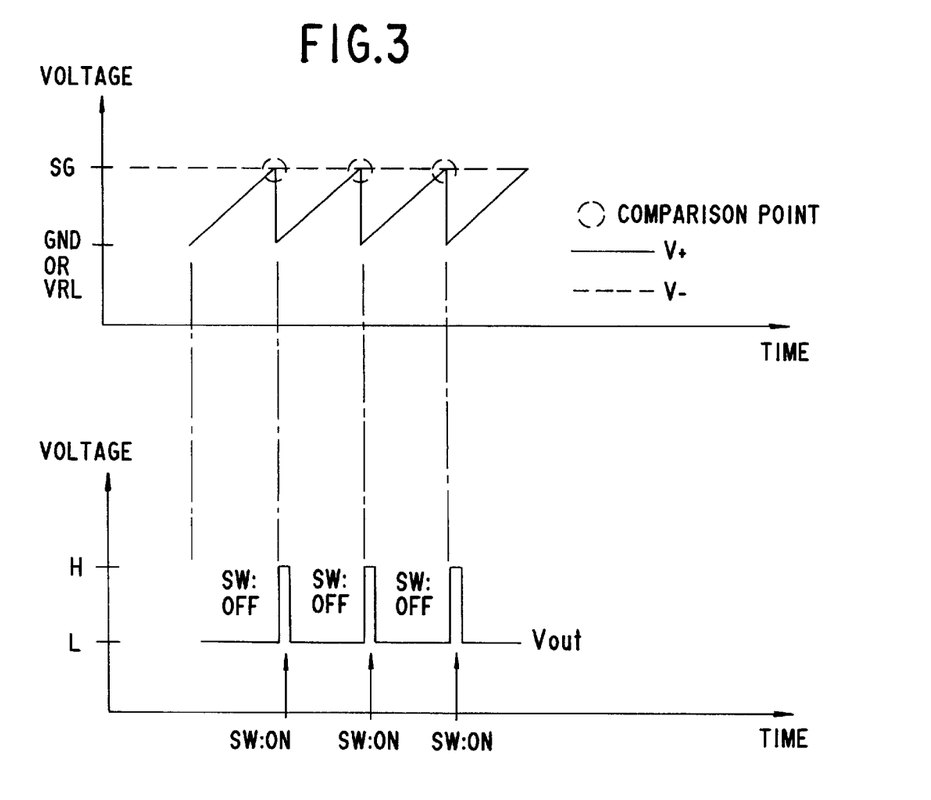
FIG. 3 is a waveform diagram for explaining the operation of the voltage-controlled oscillation circuit in FIG. 2.

FIG. 2 presents a circuit diagram showing the principle structure of the voltage-controlled oscillation circuit embodying this invention. FIG. 3 is a waveform diagram for explaining the operation of this voltage-controlled oscillation circuit. In FIG. 2, a charge/discharge capacitor C1 is connected to a current source which generates a current I1 proportional to the input voltage Vin produced by the voltage-current converter as depicted in FIG. 11, and a node A therebetween is connected to one input terminal of a comparator comp1. Provided at this node A is a switch SW14 which is controlled by the output of the comparator comp1 to connect the node A to a predetermined low reference voltage VRL. The other input terminal of the comp1 is supplied with a reference voltage SG which is set to a voltage value near the center in the operational range of the comparator comp1.

The operation of the thus constituted voltage-controlled oscillation circuit will now be discussed referring to FIG. 2. Suppose that the output Vout has an L level. Then, the switch SW14 is open and the capacitor C1 is charged with the constant current I1, causing the potential at the node A to rise. When the potential at the node A reaches the reference voltage GC, the output of the comparator comp1 becomes an H level to close the switch SW14. Consequently, the capacitor C1 is discharged quickly so that the potential at the node A drops to the ground potential or the low reference voltage VRL. The output Vout of the comparator comp1 is changed again to the L level, rendering the switch SW14 open again. Then, the potential at the node A rises again in accordance with the charging of the capacitor C1.

As the above operation is repeated, a clock pulse shown in FIG. 3 appears on the output Vout. Since the pulse width of the clock pulse on the output Vout in the L level changes in inverse proportional to the level of the constant current I1, the frequency of the output Vout is proportional to the level of the constant current I1. What is more, the point of comparison of the comparator comp1 is near the reference voltage SG. If the reference voltage SG is set close to the center in the operational range of the comparator comp1, the comparator comp1 operates in the linear operational range even if the supply voltage drops to narrow the input range of the comparator comp1. Therefore, the fast operation and the low frequency band of the voltage-controlled oscillation circuit are not affected. Even if the low reference voltage VRL lies out of the input range of the comparator comp1, the critical point of comparison of the comparator is close to the reference voltage SG in the linear operational range so that the operation of the comparator is not affected at all.

Figure 4:
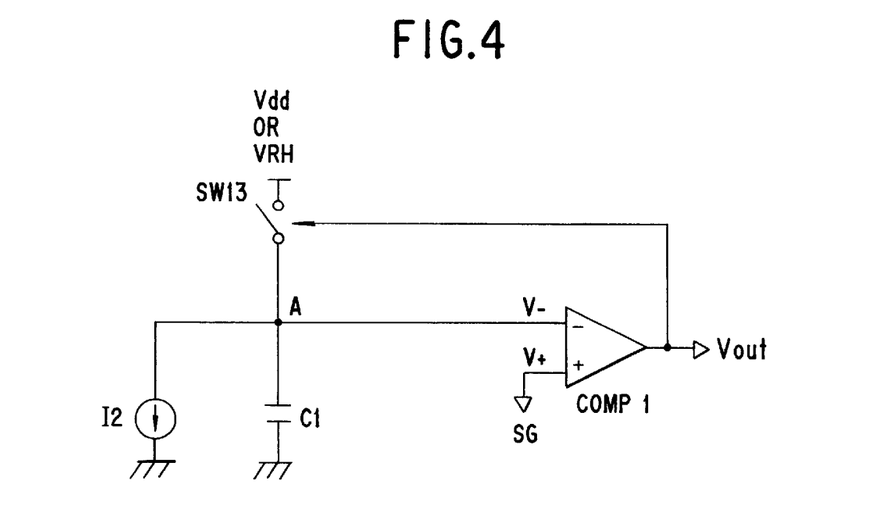
FIG. 4 is another circuit diagram showing the principle structure of the voltage-controlled oscillation circuit embodying this invention.
Figure 5:
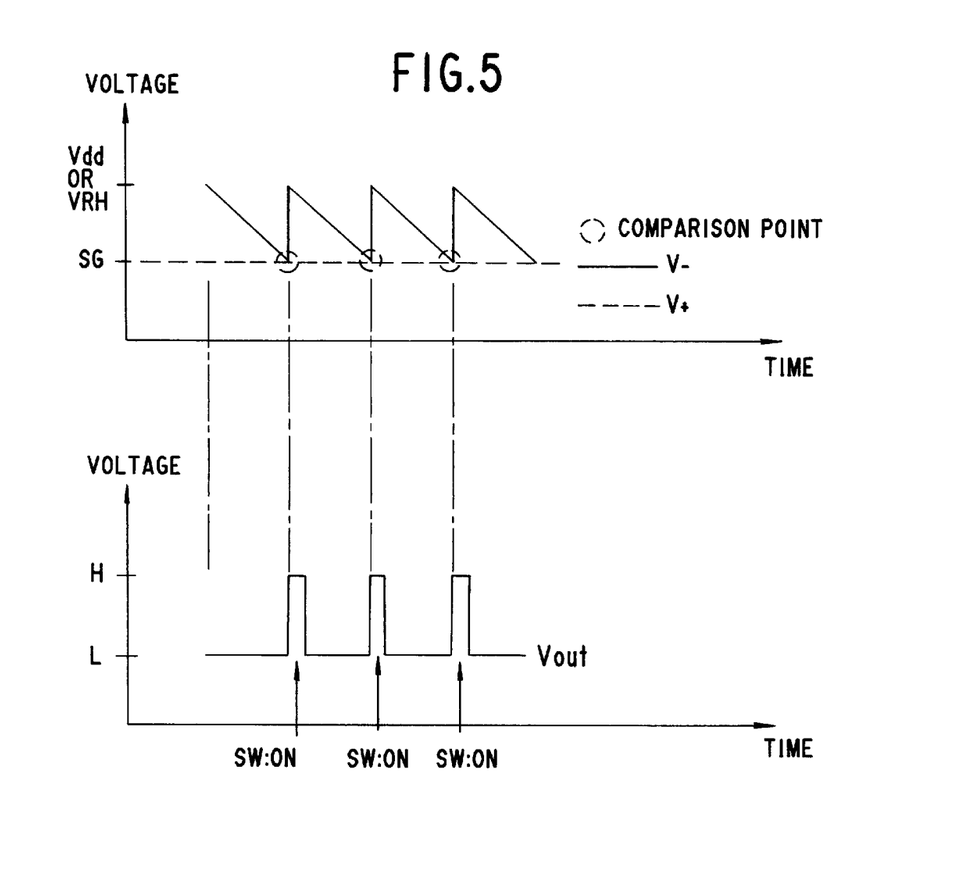
FIG. 5 is a waveform diagram for explaining the operation of the voltage-controlled oscillation circuit in FIG. 4.

FIG. 4 is another circuit diagram likewise showing the principle structure of the voltage-controlled oscillation circuit embodying this invention. FIG. 5 presents a waveform diagram for explaining the operation of this oscillation circuit. In the illustrated example, the charge/discharge capacitor C1 is connected to the current source which generates the current I2 proportional to the input voltage Vin, and the node A therebetween is connected to one input terminal of the comparator comp1. Provided at this node A is a switch SW13 which is controlled by the output of the comparator comp1 to connect the node A to a high reference voltage VRH or a supply voltage Vdd. The other input terminal of the comp1 is supplied with the reference voltage SG which is set to a voltage value close to the center in the operational range of the comparator comp1. The input terminals of the comparator comp1 being opposite to those in FIG. 2 is just a matter of polarity, so that if one wants to input the reference voltage SG and the potential at the node A to the same input terminals as shown in FIG. 2, an inverter should simply be connected to the input of the switch SW13 to invert the polarity of the output Vout.

The circuit in FIG. 4 will now be discussed referring to FIG. 5. Suppose that the output Vout has an L level. Under this situation, the capacitor C1 is discharged with the constant current I2, causing the potential at the node A to drop at a rate inversely proportional to the level of the constant current I2. When the potential at the node A reaches the reference voltage SG, the output of the comparator comp1 changes its level to an H level. As a result, the switch SW13 is closed to pull up the potential at the node A to the high reference voltage VRH. Consequently, the output of the comparator comp1 is changed again to the L level, rendering the switch SW13 open again. Consequently, the capacitor C1 is discharged with the constant current I2, thus dropping the potential at the node A again.

As the above operation is repeated, a pulse signal shown in FIG. 5 appears on the output Vout. Since the pulse width of the pulse signal is inversely proportional to the level of the constant current I2, the frequency of the pulse signal is proportional to the level of the constant current I2. Further, the point of comparison of the comparator comp1 is near the reference voltage SG, so that the operation of the comparator is not influenced by a reduction in supply voltage.

It is to be noted that the opposite end of the charge or discharge capacitor C1 in FIG. 2 or FIG. 4 to the node A should be connected to some kind of a constant voltage terminal. For instance, the capacitor in FIG. 2 may be provided between the node A and the voltage supply Vdd. Likewise, the capacitor in FIG. 4 may be provided between the node A and the voltage supply Vdd.

Figure 6:
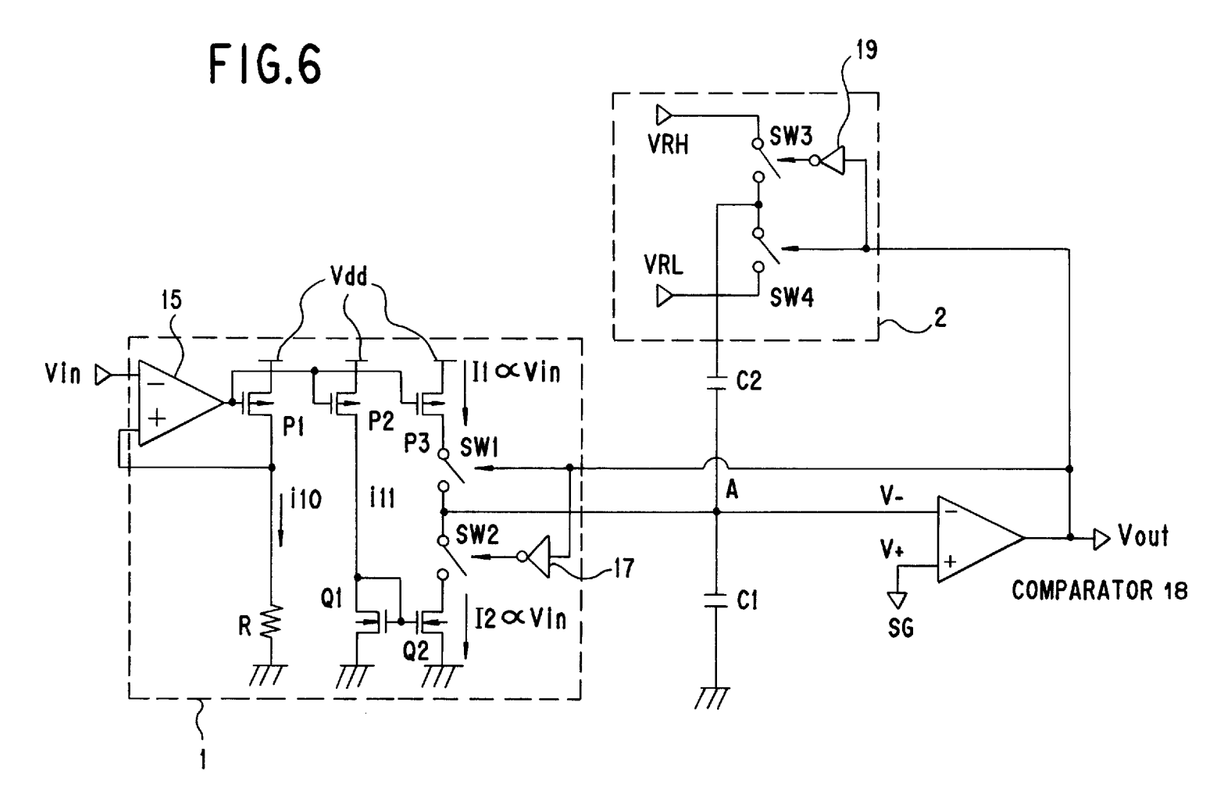
FIG. 6 is a diagram exemplifying a voltage-controlled oscillation circuit according to one embodiment of this invention.
Figure 7:
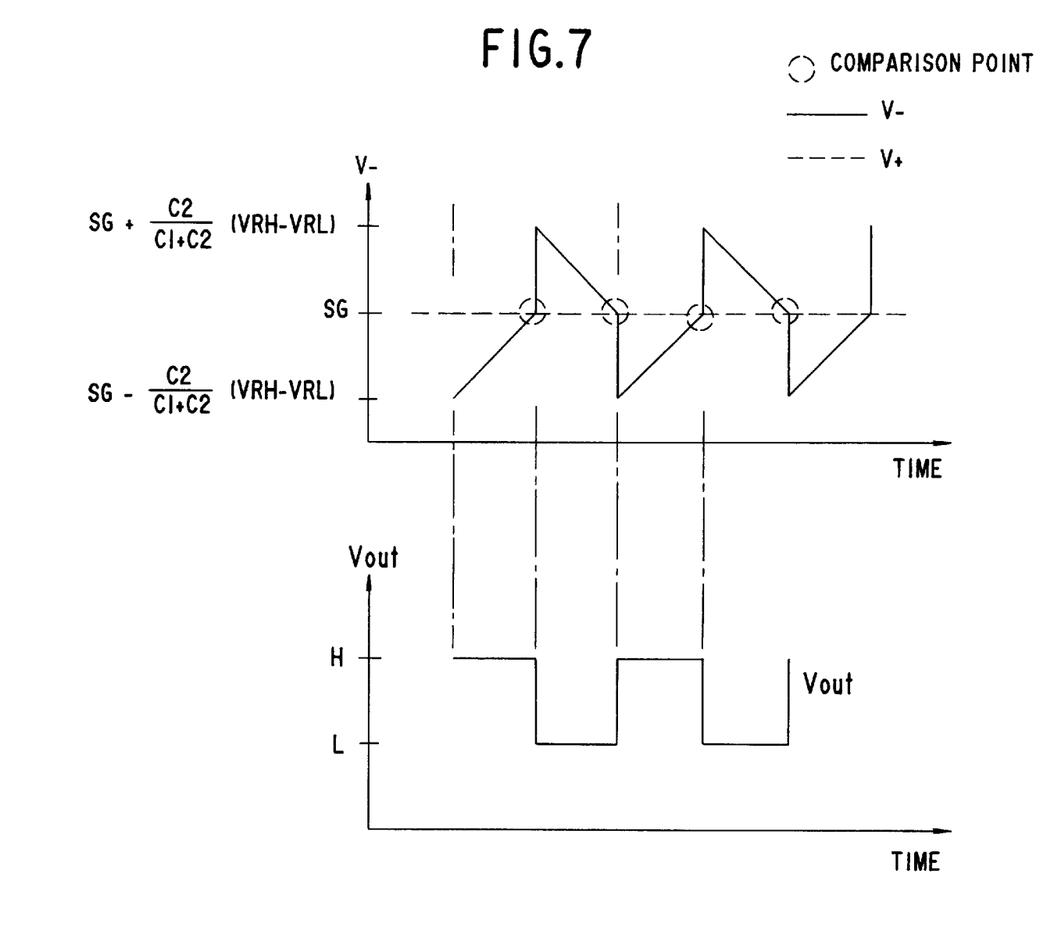
FIG. 7 is a waveform diagram for explaining the operation of the voltage-controlled oscillation circuit in FIG. 6.

FIG. 6 is a diagram exemplifying a voltage-controlled oscillation circuit which is designed based on the above-described principle circuits. FIG. 7 presents a waveform diagram for explaining the operation of this voltage-controlled oscillation circuit.

The circuit exemplified in FIG. 6 is provided with a voltage-current converter 1 which, like the one already explained with reference to FIG. 11, produces the constant currents I1 and I2 proportional to the input voltage Vin and alters the direction of the current output according to the output Vout of a comparator 18. The output of an operational amplifier 15 which receives the input voltage Vin as one input is connected to the gate of a P channel transistor P1. The other input terminal of the operational amplifier 15 is connected to a node between the drain of the transistor P1 and a resistor R. The operational amplifier 15 is so controlled that the two inputs become equal to each other. When the voltage of the input Vin is high, for example, the potential at the gate of the transistor P1 becomes low accordingly. This increases a current i10 to increase the voltage across the resistor R (i10×R) so that the operational amplifier is balanced. Therefore, the current i10 proportional to the voltage of the input Vin is produced.

Consequently, currents i11 and I1 flowing through three P channel transistors P2 and P3 connected to the voltage supply Vdd likewise have values proportional to the voltage Vin. Transistors Q1 and Q2 form a current mirror circuit, so that the value of the current I2 flowing through the transistor Q2 becomes the same as that of the current i11 flowing through the transistor Q1 if the transistor Q1 and Q2 are same. Consequently, the currents I1 and I2 both become constant currents proportional to the voltage value of the input Vin.

The output of the voltage-current converter 1 is connected to the charge/discharge capacitor C1 and the node A therebetween is connected to one input terminal V− of the comparator 18. The output Vout of the comparator 18 controls the switches SW1 and SW2 in such a way that the switches SW1 and SW2 are alternately closed. Reference numeral "17" denotes an inverter. The other input terminal V+ of the comparator 18 is supplied with the reference voltage SG which is set to the intermediate level in the input range of the comparator 18.

The node A is connected via a capacitor C2 to a high/low reference voltage generator 2 which alternately supplies the high reference voltage VRH and the low reference voltage VRL in accordance with the output Vout of the comparator 18. Specifically, the switching actions of the switches SW3 and SW4 are controlled by the output Vout. Reference numeral "19" denotes an inverter. By pulling up or pulling down the potential at the node A via the capacitor C2 by means of this high/low reference voltage generator 2, the comparison of the comparator 18 is always performed near the reference voltage SG and is not affected by any reduction in the supply voltage.

The circuit in FIG. 6 will now be discussed with reference to FIG. 7. Suppose that the output Vout has an H level. Under this situation, the switches SW1 and SW4 are closed. As the switch SW1 is closed, the current I1 flows in the capacitor C1 through the node A. As a result, the potential at the node A rises. When the potential at the node A reaches the reference voltage SG, the output Vout changes its level to an L level from the H level. Consequently, the switches SW3 and SW2 are closed. The closing of the switch SW3 connects the high reference voltage VRH to the capacitor C2, so that the potential at the node A is pulled up via the capacitor C2 in the AC manner. The pulled-up amount is the capacitance ratio of the capacitors C1 and C2 (C2/(C1+C2)). The potential at the node A is therefore pulled up to SG+{C2/(C1+C2)×(VRH−VRL)}.

With the output Vout at the L level, the switch SW2 is closed so that the capacitor C1 is discharged with the current I2. That is, the potential at the node A falls. When the potential at the node A reaches the reference voltage SG, the level of the output Vout of the comparator 18 is changed to the H level from the L level, rendering the switches SW4 and SW1 to be closed this time. As the switch SW4 is closed, the potential at the node A is pulled down to SG−{C2/(C1+C2)×(VRH−VRL)} via the capacitor C2. Then, the capacitor C1 is charged again with the current I1 via the switch SW1, causing the potential at the node A to rise.

As the above operation is repeated, the output Vout as shown in FIG. 7 is produced. Since the pulse width of the output Vout is inversely proportional to the levels of the constant currents I1 and I2, the frequency of the output Vout is proportional to the levels of the constant currents I1 and I2. In other words, the pulse output Vout whose frequency is proportional to the voltage value of the input Vin is produced.

Further, the other input terminal V+ of the comparator 18 is connected to the reference voltage SG which is set close to the center of the input range that guarantees the linear operation, and the input terminal V− of the comparator 18 is connected to the node A whose potential rises from a level lower than the reference voltage SG and falls from a level higher than that reference voltage SG. The point of comparison of the comparator 18 is therefore always close to the center (=SG) of the input range, so that even a reduction in supply voltage does not affect the operational characteristic of the comparator 18. Furthermore, the comparison is performed in the center area in the linear characteristic, the fast response characteristic is ensured. Moreover, the amplitude of the potential at the input terminal V− can be set large irrespective of the input range of the comparator. This allows the capacitance of the capacitor C1 to be reduced with respect to the current values I1 and I2. In other words, when the capacitance of the capacitor C1 is reduced, the amplitude of the potential at the node A becomes large for the same current values I1 and I2 in this invention. However, it is allowed according to the invention. Therefore, the area of the capacitor C1 when designed by an integrated circuit can be reduced.

Figure 8:
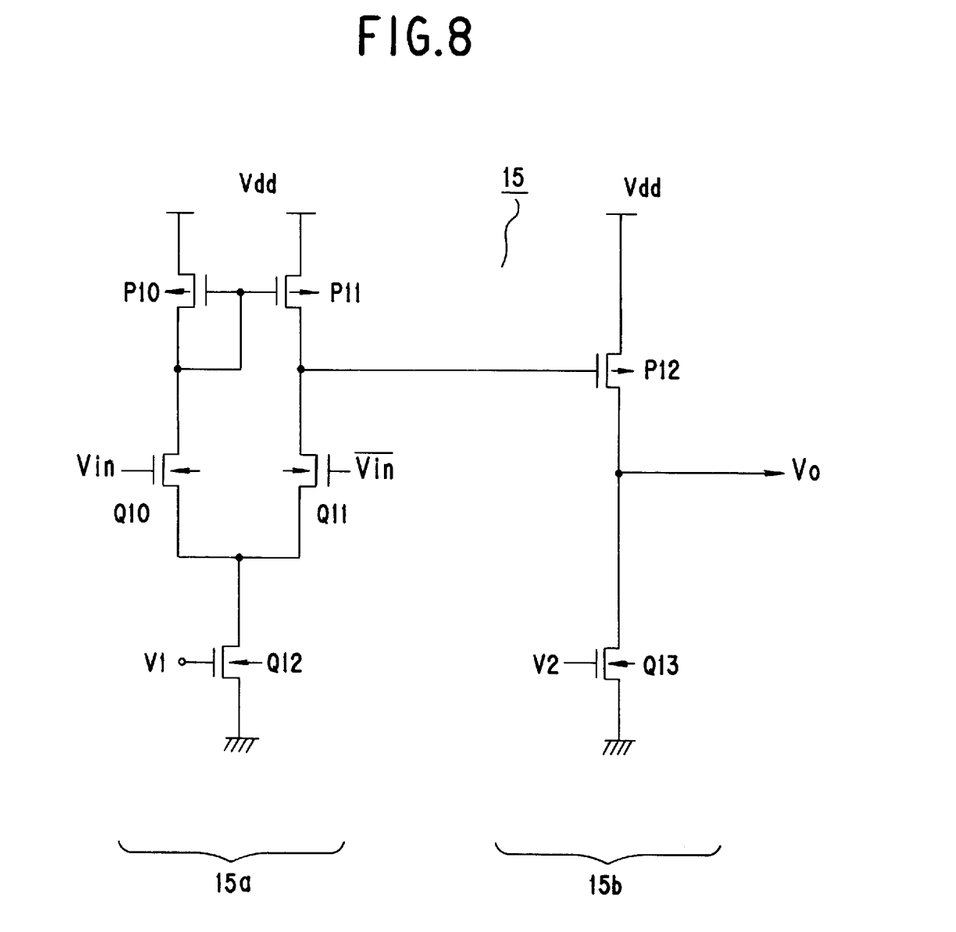
FIG. 8 is a diagram exemplifying the circuit of an operational amplifier 15 in the voltage-current converter 1 in FIG. 6.

FIG. 8 is a diagram exemplifying the circuit of the operational amplifier 15 in the voltage-current converter 1 in FIG. 6. The operational amplifier 15 comprises a comparator section 15a, which compares the input Vin and an input /Vin in the opposite phases with each other, and an amplifier section 15b, which amplifies the output of the comparator section 15a. The comparator section 15a includes load transistors P10 and P11 which form a current mirror circuit, a transistor Q12 as a constant current source whose gate is applied with a constant voltage V1, and transistors Q10 and Q11 whose gates are respectively supplied with differential inputs Vin and /Vin. The drain of the transistor Q11 is connected to the gate of a P channel transistor P12 whose drain is connected to an output terminal Vo. A transistor Q13 is a constant current source to which a constant voltage V2 is input.

When the potential of the input Vin falls, for example, the conductance of the transistor Q10 increases and the conductance of the transistor Q11 decreases. Consequently, the potential of the drain of the transistor Q11 drops and is inverted and amplified by the P channel transistor P12, thus increasing the output Vo. As a result, in the case of the operational amplifier shown in FIG. 6, the increased output Vo causes the potential of the gate of the P channel transistor P1 to rise, thus decreasing the current i10. Accordingly, the potential of the input /Vin in the opposite phase, which is the voltage dropped by the resistor R, falls and the operation of the operational amplifier becomes stable when the difference between the potentials of the two input terminals Vin and /Vin becomes zero. When the potential of the input Vin becomes higher, the current i10 increases too in quite the opposite operation to the above-described one.

Figure 9:
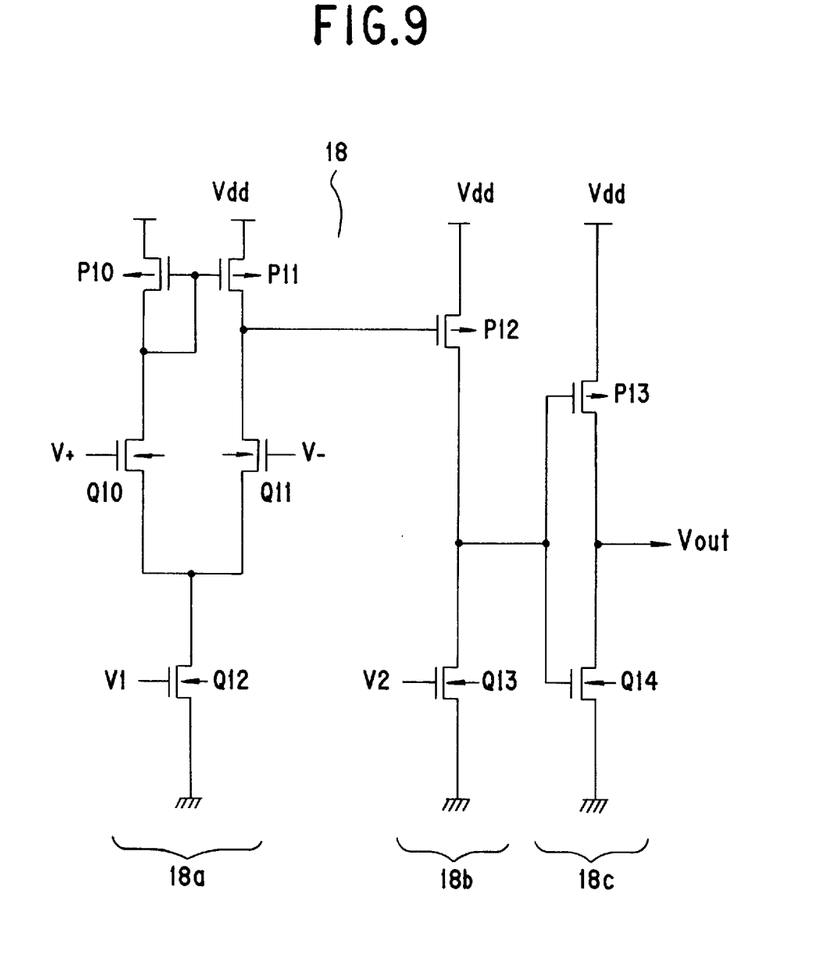
FIG. 9 is a detailed circuit diagram of a comparator 18 and a comparator comp1.

FIG. 9 presents a detailed circuit diagram of the comparator 18 in FIG. 6 and the comparator comp1 in FIGS. 2 and 4. The comparator 18 comprises an input comparator section 18a, an amplifier section 18b for amplifying the output of the input comparator section 18a, and an output converter section 18c for converting the input to an H-level or L-level digital signal in accordance with the output Vo of the amplifier section 18b. The input comparator section 18a and the amplifier section 18b are the same as the comparator section 15a and the amplifier section 15b in the operational amplifier shown in FIG. 8. In this comparator, the output of the amplifier section 18b is connected to the input terminal of a CMOS inverter, which is comprised of a P channel transistor P13 and an N channel transistor Q14. The output Vout therefore takes a digital value which becomes an H level or L level every time the potential relationship between the inputs V+ and V- is changed.

When the potential of the input terminal V+ is higher than that of the input terminal V-, for example, the conductance of the transistor Q10 becomes smaller and the conductance of the transistor Q11 becomes greater. As a result, the potential of the drain of the transistor Q11 rises and is inverted and amplified by the P channel transistor P12. Consequently, the potential of the drain of the transistor P12 decreases, thus setting the output Vout to the H level. When V+<V-, on the other hand, the output Vout becomes the L level.

As apparent from the circuit structure shown in FIG. 9, the input range that guarantees the linear operational characteristic of the input comparator section 18a to which the input terminal of the comparator is connected is affected by the potential of the voltage supply Vdd. That is, the potentials of the drains of the input transistors Q10 and Q11 are restricted to the level which is lower than the supply voltage Vdd by the threshold voltage, Vth(P), of the P channel transistor. The center of the linear characteristic of the inputs V+ and V- is located near the level higher by the threshold voltage Vth(N) of the N channel transistor than the potential of the common source of the transistors Q10 and Q11. The proper operation cannot be performed when there should be a certain potential difference between the source-drain voltages of the transistors Q10 and Q11. Therefore, the reduction in the supply voltage Vdd means that the input operational range that ensure the linear operational characteristic of the comparator section 18a becomes narrower. Of course, such an undesirable phenomenon can be avoided to some extent by reducing the threshold value of the transistors but within a certain limit.

As one input terminal of the input comparator section 18a of the comparator is fixed to the center region of the linear characteristic as in this invention, the comparing operation always goes along the linear characteristic and is thus hardly influenced by the reduction in the supply voltage Vdd.

Figure 10:
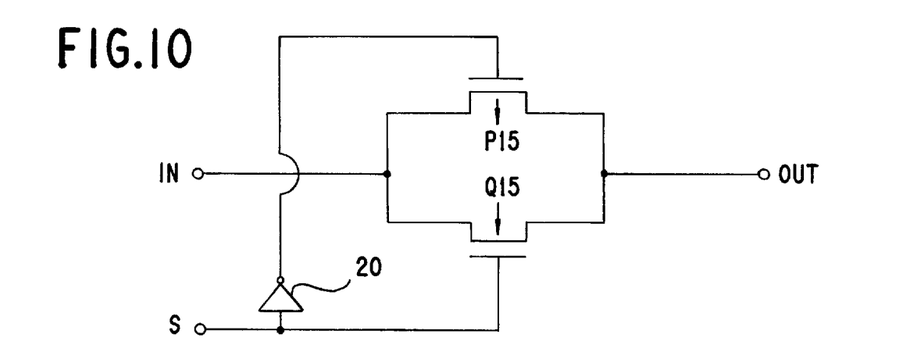
FIG. 10 is a circuit diagram of a CMOS switch circuit constituting a switch SW.

FIG. 10 is a circuit diagram of a CMOS switch circuit which constitutes any of the aforementioned switches SW1, SW2, SW3, SW4, SW13 or SW14. A P channel transistor P15 is connected in parallel to an N channel transistor Q15 and the inverted signal and non-inverted signal of the switch signal are respectively input to the gates of the transistors P15 and Q15 to be turned on (closed) or turned off (open).

The present examples and embodiment are to be considered as illustrative and not restrictive and the invention is not to be limited to the details given herein, but may be modified within the scope of the appended claims. This invention can work as long as the node A is pulled up above the reference voltage SG and/or pulled down below the reference voltage SG by the output of the comparator and the capacitor C1 is discharged or charged with the current I1 or I2 proportional to the input voltage accordingly.

It should be noted that as has been discussed earlier with reference to the principle circuit diagrams of FIGS. 2 and 4, the potential at the node A may be either pulled up or pulled down.

As apparent from the above, this invention can provide a voltage-controlled oscillation circuit which has a sufficiently wide frequency band and can keep the fast operation without being influenced if the supply voltage is reduced. If this voltage-controlled oscillation circuit is employed in a PLL circuit, therefore, the characteristic of the PLL circuit is not degraded even by a reduction in supply voltage.

What is claimed is:

1. An oscillation circuit for producing an output whose frequency accords with an input voltage value, comprising:
   a first constant current source whose current has a value according to said input voltage value;
   a charge capacitor to be charged by said first constant current source;
   a comparator having one input terminal operatively connected to a charge terminal of said charge capacitor to be charged and another input terminal supplied with a first reference voltage, for comparing inputs to both input terminals with each other and outputting an output signal having a high level or a low level; and
   a first switch for pulling down a potential of said charge terminal of said charge capacitor to a second reference voltage lower than said first reference voltage in response to said output signal of said comparator generated when said charge terminal reaches said first reference voltage,
   wherein a charge operation starts in response to the output signal of said comparator which switches said charge terminal to the first reference voltage when the potential of the charge terminal is pulled down.

2. The oscillation circuit according to claim 1, wherein said first reference voltage is set to a voltage value near an input voltage which ensures an linear operation of said comparator.

3. An oscillation circuit for producing an output whose frequency accords with an input voltage value, comprising:
   a second constant current source whose current has a value according to said input voltage value;
   a discharge capacitor to be discharged by said second constant current source;
   a comparator having one input terminal operatively connected to a discharge terminal of said charge capacitor to be discharged and an other input terminal supplied with a first reference voltage, for comparing inputs to both input terminals with each other and outputting an output signal having a high level or a low level; and
   a second switch for pulling up a potential of said discharge terminal of said discharge capacitor to a third reference voltage higher than said first reference voltage in response to said output signal of said comparator generated when said charge terminal reaches the first reference voltage,
   wherein a discharge operation starts in response to the output signal of said comparator which switches the charge terminal to the first reference voltage when the potential of the charge terminal is pulled up.

4. The oscillation circuit according to claim 3, wherein said first reference voltage is set to a voltage value near an input voltage which ensures an linear operation of said comparator.

5. An oscillation circuit for producing an output whose frequency accords with an input voltage value, comprising:
   a voltage-current converter having first and second constant current sources whose currents have values according to said input voltage value;

a charge/discharge capacitor to be charged with said first constant current and discharged with said second constant current;

a comparator having one input terminal operatively connected to a charge/discharge terminal of said charge/discharge capacitor to be charged and discharged and an other input terminal supplied with a first reference voltage, for comparing inputs to both input terminals with each other and outputting an output signal having a high level or a low level; and a high/low reference voltage generator for, under control by an output of said comparator, pulling up a potential of said charge/discharge terminal of said charge/discharge capacitor to a second reference voltage higher than said first reference voltage when potentials of both input terminals of said comparator match with each other during charging of said charge/discharge capacitor, and pulling down said potential of said charge/discharge terminal of said charge/discharge capacitor to a third reference voltage lower than said first reference voltage when said potentials of both input terminals of said comparator match with each other during discharging of said charge/discharge capacitor, whereby said voltage-current converter is controlled by said output of said comparator in such a manner as to connect said second constant current source to said charge/discharge capacitor after said potential of said charge/discharge terminal of said charge/discharge capacitor is pulled up to said second reference voltage and to connect said first constant current source to said charge/discharge capacitor after said potential of said charge/discharge terminal of said charge/discharge capacitor is pulled down to said third reference voltage.

6. The oscillation circuit according to claim 5, wherein said first reference voltage is set to a voltage value near an input voltage which ensures an linear operation of said comparator.

7. The oscillation circuit according to claim 5, wherein said second reference voltage is set to a predetermined voltage lower than a supply voltage.

8. The oscillation circuit according to claim 5, wherein said third reference voltage is set to a predetermined voltage equal to or higher than a ground voltage.

9. The oscillation circuit according to claim 5, wherein said voltage-current converter further has a first switch, provided between said first constant current source and said charge/discharge terminal of said charge/discharge capacitor and to be closed and opened under control by said output of said comparator, and a second switch, provided between said second constant current source and said charge/discharge terminal of said charge/discharge capacitor and to be opened and closed under control by said output of said comparator, said first and second switches being alternately closed and opened.

10. The oscillation circuit according to claim 5, wherein said high/low reference voltage generator is connected via a coupling capacitor to said charge/discharge terminal of said charge/discharge capacitor and has a third switch, provided between a terminal for said second reference voltage and said coupling capacitor and to be closed and opened under control by said output of said comparator, and a fourth switch, provided between a terminal for said third reference voltage and said coupling capacitor and to be opened and closed under control by said output of said comparator, said third and fourth switches being alternately closed and opened.

11. A phase locked loop (PLL) circuit for generating an output signal of a frequency a predetermined number of times higher than that of an input signal and synchronous in phase with said input signal, comprising:

a phase comparator for detecting a phase difference between said input signal and a comparison signal acquired by frequency-dividing said output signal by a predetermined number, and outputting an output voltage according to said phase difference;

an oscillation circuit as recited in any one of claims 1 to 10, for receiving an output voltage of said phase comparator as an input voltage and producing said output signal as an output; and a frequency divider for frequency-dividing said output signal by said predetermined number.

* * * * *